United States Patent [19]

Wong

[11] Patent Number: 4,564,562
[45] Date of Patent: Jan. 14, 1986

[54] SILICONE ENCAPSULATED DEVICES

[75] Inventor: Ching-Ping Wong, Lawrence Township, Mercer County, N.J.

[73] Assignee: AT&T Technologies, Inc., Berkeley Heights, N.J.

[21] Appl. No.: 614,898

[22] Filed: May 29, 1984

[51] Int. Cl.$^4$ .............................................. B32B 9/04
[52] U.S. Cl. ................................ 428/447; 174/110 S; 427/96; 528/32; 528/34; 528/38; 528/901
[58] Field of Search ............... 174/110 S; 428/447; 427/96; 528/38, 34, 901, 32

[56] References Cited

U.S. PATENT DOCUMENTS

| | | | |
|---|---|---|---|
| 3,674,738 | 7/1942 | Nitzsche et al. | 260/46.5 G |
| 3,678,003 | 7/1972 | Kaiser et al. | 260/46.5 G |
| 3,686,357 | 8/1972 | Cheeseman | 260/825 |
| 3,702,769 | 11/1972 | Vaughn | 106/10 |
| 3,923,736 | 12/1975 | Nitzsche et al. | 260/46.5 G |
| 3,983,265 | 9/1976 | Letoffe | 174/110 S |
| 4,036,813 | 7/1977 | Hardman et al. | 260/46.5 G |
| 4,219,607 | 8/1980 | Cammack, II et al. | 174/110 S |
| 4,248,993 | 2/1981 | Takago | 528/38 |
| 4,318,939 | 3/1982 | Wong | 524/857 |
| 4,431,472 | 2/1984 | Hohl et al. | 156/307.3 |

*Primary Examiner*—Melvyn I. Marquis
*Attorney, Agent, or Firm*—J. F. Spivak

[57] ABSTRACT

An article of manufacture comprises an electronic device having a silicone resin encapsulant thereover, wherein the silicone resin is an oxime and water free formulation derived from curing a mixture consisting essentially of a heat curable silicone elastomer prepolymer and a dialkylaminoalkoxysilane. The mixture may also contain fillers and a small amount of curing catalyst and stabilizer.

10 Claims, 3 Drawing Figures

SILICONE ENCAPSULATED DEVICES

TECHNICAL FIELD

This invention relates to electronic devices which are encapsulated by means of a polymeric encapsulant and more particularly, to such devices which are encapsulated by means of a silicone resin.

BACKGROUND OF THE INVENTION

Silicone resins have been used in various industrial applications because of their thermal stability, dielectric properties, mechanical properties, chemical resistance and resistance to atmospheric deterioration. One such use is as an encapsulant for electronic devices, e.g., integrated circuit devices and hybrid integrated circuits. However, it has been found in certain applications, e.g., where adhesion is required to a gold or tantalum surface and device processing subsequent to encapsulation includes a cleaning step in solvents such as Freon ®, the silicone encapsulant tends not to adhere well to the metal surface and further often exhibits swelling and bleeding. At the present time there are no commercially available screen printable silicone resins which exhibit the desired adhesion to gold and tantalum surfaces especially when processing includes exposure of the encapsulated device to Freon ®. I have now discovered a modifier for silicone resins which eliminates the aforementioned problems and allows selective encapsulation over gold or tantalum surfaces by screen printing methods as well as other coating processes.

SUMMARY OF THE INVENTION

An article of manufacture comprises an electronic device having a silicone resin encapsulant thereover, wherein the silicone resin formulation is free of oxime and water and is derived from curing a mixture consisting essentially of a heat curable silicone elastomer prepolymer and a dialkylaminoalkoxysilane. The mixture may also contain fillers and a small amount of curing catalyst and stabilizer.

DETAILED DESCRIPTION

Figure 1:
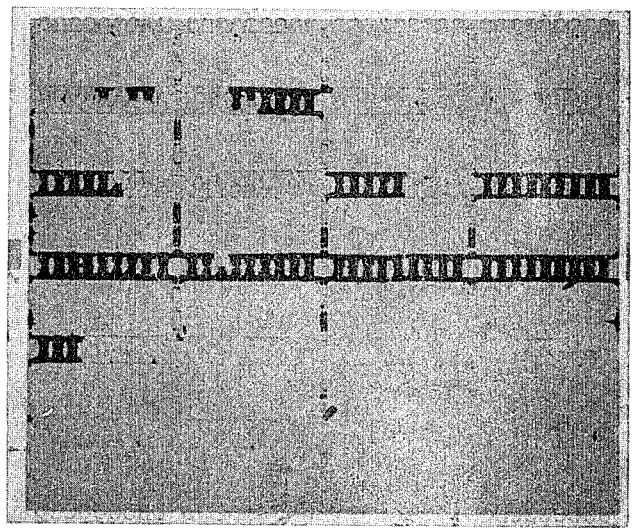
FIG. 1 is a photograph of a Freon ® treated gold patterned substrate encapsulated in a heat cured silicone resin formulation not including the dialkylaminoalkoxysilane additive.

The need for improved silicone resins for encapsulating electronic devices having gold terminal pads and which undergo post encapsulant cleaning in solvents such as Freon TMC (Freon TF ® of DuPont Co. and methylene chloride solvent mixture) can best be illustrated with reference to FIG. 1. This figure shows the poor adhesion to a gold surface of a commercially available, heat curable, silicone encapsulant after exposure to the Freon. The problem of adhesion of silicone encapsulants to gold is one that has been recognized in the industry and has limited the use of silicones in certain manufacturing processes. In comparison, referring to FIG. 2, one can see the excellent adhesion to gold of the silicone encapsulant which has been modified in accordance with this invention by the addition of the dialkylaminoalkoxysilane. This surface was exposed to the same Freon treatment as that shown in FIG. 1.

The improvement is achieved by adding a compound having functional groups which act as a cross-linking agent, a catalyst and a promoter to an oxime free and water free heat curable silicone elastomer prepolymer and then heat curing the mixture subsequent to coating or encapsulating the device or substrate to be encapsulated. Suitable compounds are the dialkylaminotrialkoxysilanes, and dialkylaminodialkoxysilanes, particularly those wherein the alkyl and alkoxy groups have from one to four carbon atoms, the amine groups include a secondary and a primary amine nitrogen separated by an alkyl group and wherein an alkyl group separates the secondary amine nitrogen from the silicon atom. A preferred additive is N-2-aminoethyl-3 aminopropyl-trimethoxy silane ($NH_2CH_2CH_2NH CH_2CH_2CH_2Si(OCH_3)_3$). Such additives are effective in preventing delamination, blistering and swelling even when present in small quantities, e.g., 0.5 to 3 weight percent. Generally, one weight percent is sufficient when using the preferred compound indicated above.

It has further been discovered that another benefit achieved by the addition of these dialkylaminoalkoxysilanes to a heat curable silicone formulation as set forth herein, is the reduction of the curing temperature. For example, the curing temperature to achieve the same degree of cure over the same time period for DC-649, a Dow Corning hydro-vinyl-function-phenyl methyl siloxane was reduced from 200° C. to 150° C. by the addition of the silane. If longer time periods are tolerable, the resin can now be cured at 120° C., if desired. This reduction in curing temperature is important in maintaining better yields of encapsulated IC devices.

In general, the novel formulations which exhibit the superior adhesion to gold and tantalum metal surfaces, even under severe solvent cleaning conditions employed in the electronics industry, are free of oximes and are heat curable as opposed to room temperature moisture curable and are also free of water. These formulations consist essentially of a heat curable silicone elastomer prepolymer in an amount of from 20 to 25 weight percent and having an average molecular weight of from 400,000 to 600,000, 0.5 to 2.0 weight percent of a dialkylaminoalkoxysilane wherein one amine group is a secondary amine and the other is a primary amine and the amine nitrogen is not directly coupled to the silicon atom; 0 to 80 weight percent filler; 0 to 2 weight percent curing catalyst and 0 to 0.2 weight percent stabilizer. To the above formulation, one may add a solvent to adjust viscosity.

Suitable heat curable silicone elastomers are known in the art and are commercially available. The alkyl groups of the suitable silanes are preferably from 1 to 4 carbon atoms in length and the alkoxy groups are preferably methoxy but can be ethoxy or propoxy. Also, the silane can be a trialkoxy or a dialkoxy silane. When it is a dialkoxysilane, the remaining radical bonded to the silicon atom may be hydrogen or an alkyl group of from 1 to 3 carbon atoms. Preferred materials are hereinafter set forth. The fillers are generally employed to control viscosity and should be limited in amount to allow for good dispersion and desired viscosity control. The fillers should be inert and are generally of fine particle size. Typical fillers are silica and alumina.

While the dialkylaminoalkoxy silane acts to catalyze curing, an additional curing catalyst, e.g., a tri-aminoalkylalkoxysilane may be added as well. Also stabilizers such as metal complexes and phosphites as are known in the art may be employed.

The quantity limits of the additives should be adhered to in order to assure achieving the desired physical, chemical and electrical properties of the cured elastomer.

EXAMPLE 1

A screen printable heat curable silicone resin formulation was prepared in accordance with the following formulation wherein DC-649 is a hydroxy functional phenyl-methyl siloxane made by Dow Corning, Midland, Michigan and BASF-5882 is an organic type pigment.

| Ingredient | Weight Percent |
|---|---|
| DC-649 | 23.9 |
| buffered amine catalyst | 1 |
| silica filler | 75 |
| pigment | 0.1 |
| terpinol solvent | — |

The solvent is not included in calculating the weight percent of the components and is employed to the extent necessary to achieve the desired viscosity for the screen printing or other coating technique to be employed. The viscosity can also be adjusted by changing the amount of filler.

The above formulation was printed on a test substrate containing gold plated surfaces and cured at 200° C. for 4–6 hours. The substrates were then processed by exposing them to a Freon TMC cleaning operation wherein, as can be seen in FIG. 1, it was found that the silicone delaminated, swelled and/or bled in the areas over the gold.

EXAMPLE 2

Figure 2:
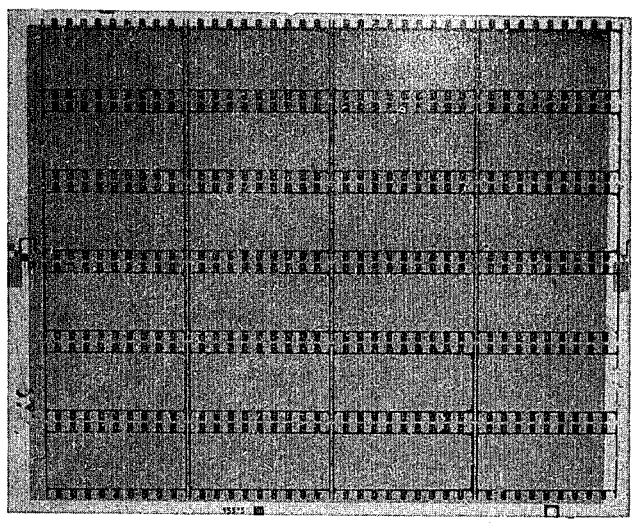
FIG. 2 represents a similar gold patterned substrate treated in a similar manner but having an encapsulant similar to the above but which includes the dialkylaminoalkoxysilane additive in accordance with this invention.

The formulation of Example 1 was modified by adding 1 weight percent N-2-aminoethyl-3-aminopropyl-trimethoxysilane. It was found that to reach the same degree of cure in the same time, curing temperatures should be reduced to 150° C. Further, as can be seen in FIG. 2, no delamination, swelling or bleeding occurred on the screen printed gold surfaced substrates even after exposure to the same Freon TLC treatment as previously performed on the samples made from the formulation of Example 1.

Similar results were achieved when the dialkylaminoalkoxy silane of Example 2 was replaced with (aminoethylaminomethyl)-phenethyltrimethoxysilane or N-(2-aminoethyl)-3-aminopropylmethyldimethoxysilane.

The preferred formulations generally include 20 to 25 weight percent heat curable silicone elastomer prepolymer, 0.5 to 2 weight percent dialkylaminoalkoxysilane, 1 to 2 weight percent amine catalyst, 73 to 80 weight percent silica filler and 0.1 to 0.2 weight percent pigment in a viscosity controlling solvent.

In comparison, alternative additives such as silanes containing a single amine group, an oxime group, mercapto groups or where the nitrogen was coupled to the silicon atom and the like, either did not enhance adhesion of the screen printable, heat curable silicones to a gold surface and/or resulted in less than adequate electrical resistivity of the cured encapsulant.

Figure 3:
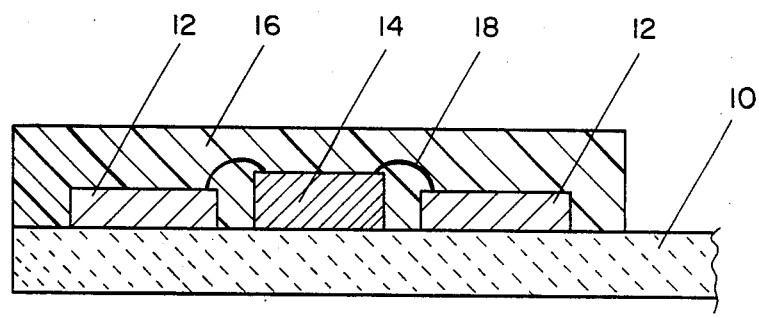
FIG. 3 is an elevational cross-sectional view of a typical I.C. encapsulated circuit utilizing a silicone encapsulant.

Referring to FIG. 3 there is shown an example of a hybrid integrated circuit 10 having a gold plated electrode pattern 12 thereon for ease of bonding to integrated circuit chips 14 on the device 10. The entire device, in this instance is coated with the novel silicone formulation 16. The circuit chips 14 are bonded to the electrode pattern by means of wire bonds 18. Alternatively, of course, one can coat discrete components or portions of the device by well known screen printing techniques.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. An article of manufacture comprising an electronic device having a heat cured silicone resin encapsulant thereover wherein said encapsulant is derived from curing an oxime and water free heat curable resin silicone elastomer prepolymer consisting essentially of from 20 to 25 weight percent of the prepolymer having an average molecular weight of from 400,000 to 600,000; 0.5 to 2 weight percent of a dialkylaminoalkoxysilane wherein neither of the amine nitrogen atoms are directly coupled to the silicon atom; 0 to 80 weight percent inorganic filler; and 0 to 2 weight percent curing catalyst.

2. The article recited in claim 1, wherein the dialkylaminoalkoxysilane is selected from a dialkoxysilane and a trialkoxysilane wherein the alkoxy groups have from 1 to 4 carbon atoms and the alkyl groups have from 1 to 4 carbon atoms, and wherein one amine is a primary amine and the other amine is a secondary amine which is separated from the silicon atom and the primary amine nitrogen by alkyl groups.

3. The article recited in claim 1, wherein the dialkylaminoalkoxysilane is selected from the group consisting of N-2-aminoethyl-3-aminopropyltrimethoxysilane, (aminoethylamino-methyl)phenethyltrimethoxysilane; and N-(2-aminoethyl)-3-aminopropylmethyldimethoxysilane.

4. The article recited in claim 1, wherein the silane is N-2-aminoethyl-3-aminopropyl-trimethoxysilane.

5. The article recited in claim 1, wherein the elastomer consists essentially of 20 to 25 weight percent silicone prepolymer, 1 to 2 weight percent catalyst, 73 to 80 weight percent silica, 0.1 to 0.2 weight percent stabilizer and 0.5 to 2 weight percent dialkylaminoalkoxysilane and in a viscosity controlling solvent.

6. A screen printable, heat curable, silicone elastomer composition which is oxime and water free comprises 20 to 25 weight percent of the prepolymer having an average molecular weight of from 400,000 to 600,000; 0.5 to 2 weight percent of a dialkylaminoalkoxy silane wherein neither of the amine nitrogen atoms are directly coupled to the silicon atom; 0 to 80 weight percent inorganic filler; and 0 to 2 weight percent curing catalyst.

7. The composition recited in claim 6, wherein the dialkylaminoalkoxysilane is selected from a dialkoxysilane and a trialkoxysilane wherein the alkoxy groups have from 1 to 4 carbon atoms and the alkyl groups have from 1 to 4 carbon atoms, and wherein one amine is a primary amine and the other amine is a secondary amine which is separated from the silicon atom and the primary amine nitrogen by alkyl groups.

8. The composition recited in claim 6, wherein the dialkylaminoalkoxysilane is selected from the group consisting of N-2-aminoethyl-3-aminopropyltrimethoxysilane; (aminoethylamino-methyl)phenethyltrimethoxysilane; and N-(2-aminoethyl)-3-aminopropylmethyldimethoxysilane.

9. The composition recited in claim 6, wherein the silane is N-2-aminoethyl-3-aminopropyltrimethoxysilane.

10. The composition recited in claim 6, wherein the elastomer consists essentially of 20 to 25 weight percent silicone prepolymer, 1 to 2 weight percent catalyst, 73 to 80 weight percent silica, 0.1 to 0.2 weight percent metal complex stabilizer and 0.5 to 2 weight percent dialkylaminoalkoxysilane and in a viscosity controlling solvent.

* * * * *